US012690350B2

(12) United States Patent
Wang

(10) Patent No.: US 12,690,350 B2
(45) Date of Patent: Jul. 21, 2026

(54) DISPLAY PANEL HAVING FILLING LAYER FILLING UP THIRD OPENING AND CONTACTING PACKAGING LAYER AND DISPLAY DEVICE

(71) Applicant: Shenzhen China Star Optoelectronics Semiconductor Display Technology Co., Ltd., Shenzhen (CN)

(72) Inventor: Min Wang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1247 days.

(21) Appl. No.: 17/621,594

(22) PCT Filed: Dec. 8, 2021

(86) PCT No.: PCT/CN2021/136400
§ 371 (c)(1),
(2) Date: Jun. 8, 2023

(87) PCT Pub. No.: WO2023/097716
PCT Pub. Date: Jun. 8, 2023

(65) Prior Publication Data
US 2024/0032365 A1      Jan. 25, 2024

(30) Foreign Application Priority Data
Dec. 2, 2021      (CN) .......................... 202111459156.2

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/124* (2023.02); *H10K 2102/103* (2023.02)

(58) Field of Classification Search
CPC ........... H10K 59/1315; H10K 59/1213; H10K 59/124; H10K 2102/103
(Continued)

(56) References Cited

U.S. PATENT DOCUMENTS

| | | | |
|---|---|---|---|
| 2009/0309493 A1 | 12/2009 | Seo | |
| 2018/0097047 A1* | 4/2018 | Jung | .................... H10K 59/122 |
| 2022/0013609 A1* | 1/2022 | Won | .................... H10K 59/124 |

FOREIGN PATENT DOCUMENTS

| | | |
|---|---|---|
| CN | 1783508 A | 6/2006 |
| CN | 106057844 A | 10/2016 |

(Continued)

OTHER PUBLICATIONS

Chinese Office Action issued in corresponding Chinese Patent Application No. 202111459156.2 dated Nov. 22, 2022, pp. 1-15.

*Primary Examiner* — Xia L Cross
(74) *Attorney, Agent, or Firm* — PV IP PC; Peter Stecher; Wei Te Chung

(57)      ABSTRACT

A display panel and a display device are provided. The display panel includes a TFT layer, an auxiliary electrode, a protection layer having a first opening, a connection layer positioned above the protection layer, a first electrode positioned above the connection layer, and a second electrode positioned above the connection layer. The first electrode is positioned above the connection layer and electrically connected to the TFT through the first opening. The second electrode is electrically connected to the auxiliary electrode through a via.

20 Claims, 3 Drawing Sheets

100

(51) Int. Cl.
    *H10K 59/124*     (2023.01)
    *H10K 102/10*     (2023.01)

(58) Field of Classification Search
    USPC ........................................................ 257/40
    See application file for complete search history.

(56)                 References Cited

FOREIGN PATENT DOCUMENTS

| | | | |
|---|---|---|---|
| CN | 107342304 | A | 11/2017 |
| CN | 108538890 | A | 9/2018 |
| CN | 109671739 | A | 4/2019 |
| CN | 109980119 | A | 7/2019 |
| CN | 110071225 | A | 7/2019 |
| CN | 111952341 | A | 11/2020 |
| CN | 111969034 | A | 11/2020 |
| CN | 113097409 | A | 7/2021 |
| CN | 113097412 | A | 7/2021 |
| CN | 113224254 | A | 8/2021 |
| CN | 113345945 | A | 9/2021 |
| CN | 113488514 | A | 10/2021 |
| EP | 3136440 | A1 | 3/2017 |

* cited by examiner

DISPLAY PANEL HAVING FILLING LAYER FILLING UP THIRD OPENING AND CONTACTING PACKAGING LAYER AND DISPLAY DEVICE

FIELD OF THE DISCLOSURE

The present disclosure relates to a display technology, and more particularly, to a display panel and a display device.

BACKGROUND

The top-emission organic light-emitting diode (OLED) display has advantages, such as thin, wide color field, wide view angles, low power consumption and high resolution. It could be widely used in a smart home electronics or wearable equipments, such as 4K or 8K high resolution television. The anode of the top-emission OLED display is a metal of a metal oxide having a high reflection rate. The cathode of the top-emission OLED display is a metal or oxide having a good transparency. In this way, the light could be emitted through the cathode. However, the cathode is often manufactured with IZO, Ag and Mg. IZO is a transparent metal oxide but has a higher resistance. Mg and Ag have a lower resistance but the film layer of the Mg or Ag cannot be thick in order to ensure the higher transparency. In this way, there is a higher area resistance regardless Mg, Ag or IZO is used. This results in an IR drop between the edge and center of the display screen and thus the edge is brighter and the center is darker during the display procedure. That is, the luminance unevenness between the edge and the center occurs.

SUMMARY

One objective of an embodiment of the present disclosure is to provide a display panel and a display device to improve the luminance unevenness between the center and the edge.

According to an embodiment of the present disclosure, a display panel is disclosed. The display panel includes a TFT layer, an auxiliary electrode, a protection layer having a first opening, a connection layer positioned above the protection layer, a first electrode positioned above the connection layer, and a second electrode positioned above the connection layer. The first electrode is positioned above the connection layer and electrically connected to the TFT. The second electrode is positioned above the connection layer. The light emitting layer is positioned above the connection layer and electrically connected to the first electrode and the second electrode. The light emitting layer is disconnected at a position of the via, and the second electrode is electrically connected to the auxiliary electrode through the via.

In some embodiments of the present disclosure, the light emitting layer comprises a first part disconnected at the position of the via. The second electrode comprises a second part disconnected at the position of the via, and the first part is positioned above the first part and electrically connected to the auxiliary electrode through the via.

In some embodiments of the present disclosure, the second part directly contacts the auxiliary electrode and a contact part of the second part contacting the auxiliary electrode is blocked by the blocking portion.

In some embodiments of the present disclosure, the TFT layer comprises a source/drain layer that comprises a drain of the TFT. The protection layer has a first opening. The connection layer comprises a connection part, and the first electrode is electrically connected to the drain of the TFT through the connection part at the first opening.

In some embodiments of the present disclosure, the auxiliary electrode and the drain are at a same layer and of a same material.

In some embodiments of the present disclosure, the source/drain layer further comprises a solder pad positioned in a non-display region of the display panel. The protection layer comprises a fourth opening exposing the solder pad. The connection layer comprises a protection portion electrically connected to the solder pad through the fourth opening. The protection portion fully covers the solder pad in a top view.

According to an embodiment of the present disclosure, a display device is disclosed. The display panel includes a TFT layer, an auxiliary electrode, a protection layer having a first opening, a connection layer positioned above the protection layer, a first electrode positioned above the connection layer, and a second electrode positioned above the connection layer. The protection layer is positioned above the TFT layer and the auxiliary electrode. The connection layer is positioned above the protection layer. The connection layer comprises a blocking portion. The blocking portion and the protection layer comprise a second opening. A bottom width of the second opening is greater than a top width of the second opening. The light emitting layer is positioned between the first electrode and the second electrode. A material of the connection layer comprises molybdenum and/or titanium. The first electrode is electrically connected to the TFT through the connection portion at a position of the first opening. The light emitting layer is disconnected at a position of the second opening. The second electrode is electrically connected to the auxiliary electrode through the second opening.

According to an embodiment of the present disclosure, a display device with a display panel is disclosed. The display panel includes a TFT layer, an auxiliary electrode, a protection layer having a first opening, a connection layer positioned above the protection layer, a first electrode positioned above the connection layer, and a second electrode positioned above the connection layer. The protection layer is positioned above the TFT layer and the auxiliary electrode. The connection layer is positioned above the protection layer. The connection layer comprises a blocking portion. The blocking portion and the protection layer comprise a second opening. A bottom width of the second opening is greater than a top width of the second opening. The light emitting layer is positioned between the first electrode and the second electrode. A material of the connection layer comprises molybdenum and/or titanium. The first electrode is electrically connected to the TFT through the connection portion at a position of the first opening. The light emitting layer is disconnected at a position of the second opening. The second electrode is electrically connected to the auxiliary electrode through the second opening.

In the display panel and the display device according to an embodiment of the present disclosure, a connection layer is positioned between the TFT layer and the first electrode. A via is formed in the blocking portion and the protection layer such that the second electrode is connected to the auxiliary electrode through via. This could effectively and stably reduce the resistance of the second electrode such that the IR drop of the second electrode. This could improve the luminance unevenness between the center and the edge.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION

Specifically, the terminologies in the embodiments of the present disclosure are merely for describing the purpose of the certain embodiment, but not to limit the disclosure. Examples and the appended claims be implemented in the present disclosure requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

Figure 1:
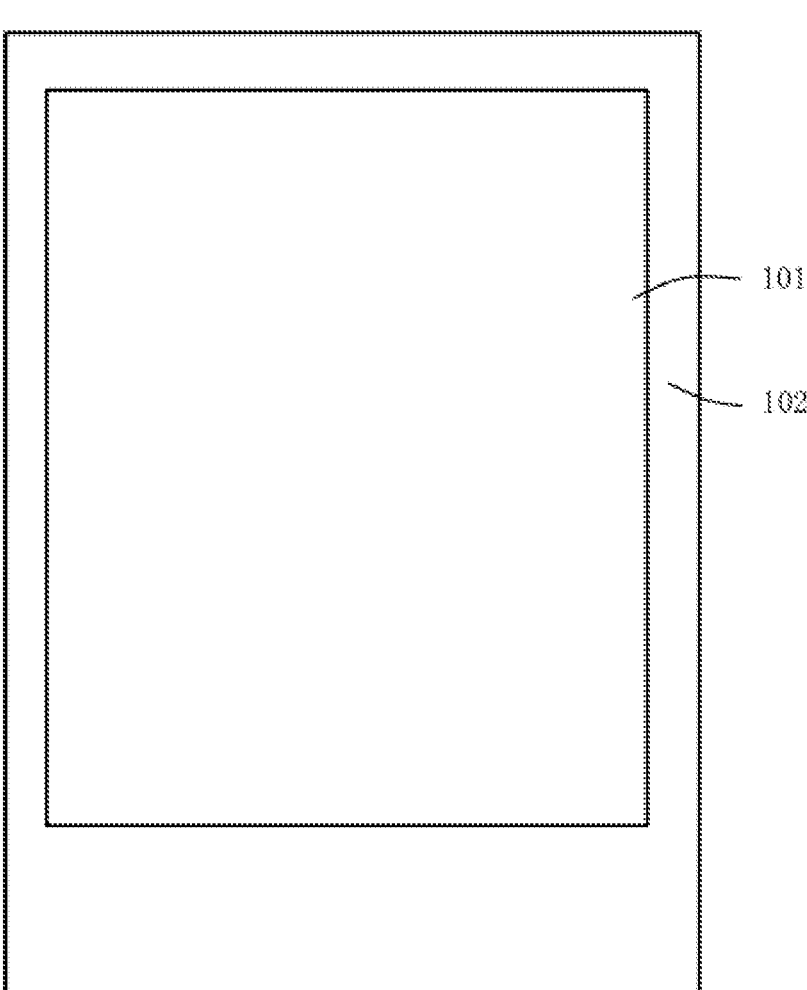
FIG. 1 is a diagram of a display panel according to an embodiment of the present disclosure.

Please refer to FIG. 1. According to an embodiment of the present disclosure, a display panel 100 is disclosed. The display panel 100 comprises a display region 101 and a non-display 102. The display region is used to place the pixels and the pixel driving circuits to achieve the light emitting function. The non-display region 102 is used to place the peripheral circuit to provide all kinds of signals to the pixel driving circuits to achieve the light emitting control of the pixels. The display panel 100 could be an OLED display panel 10.

Figure 2:
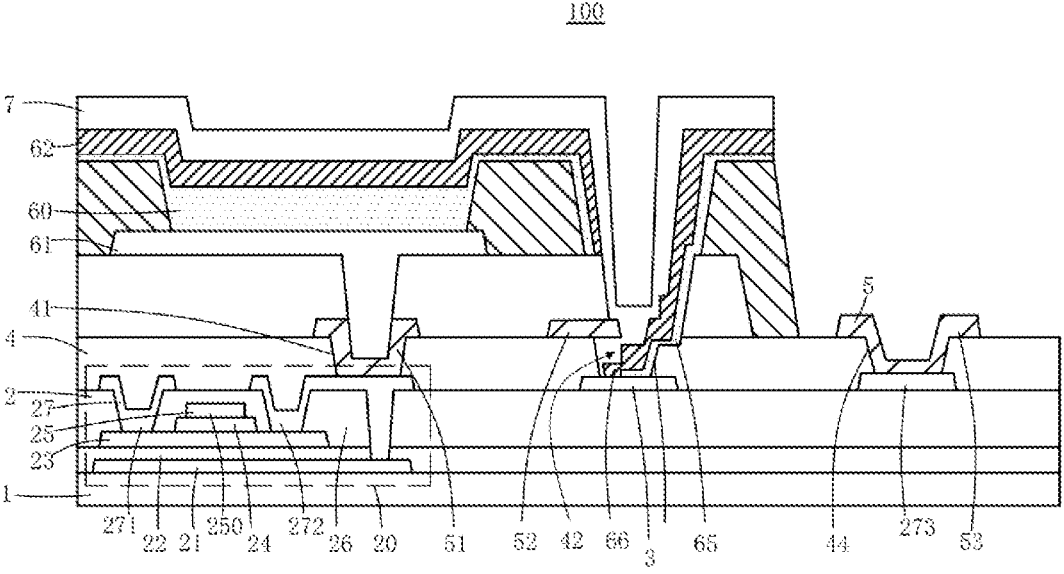
FIG. 2 is a diagram of a cross section of a display panel according to an embodiment of the present disclosure.

Please refer to FIG. 2. The display panel 100 comprises a substrate 1, a thin film transistor (TFT) layer 2, an auxiliary electrode 3, a protection layer 4, a connection layer 5, a first electrode 61, a light emitting layer 60 and a second electrode 62. The TFT layer 2 comprises a plurality of TFTs 20 positioned in the display region 101. The TFTs 20 could form a pixel driving circuit. Multiple electric signals are inputted into the display region 101 from the non-display region 102. The TFTs 20 could achieve the current control between the first electrode 61 and the second electrode 62 such that the light emitting layer 60 is controlled to generate light.

The substrate could comprise a solid material, such as a glass, or flexible material, such as a plastic, a polyimide or other polymer.

The TFT layer 2 is positioned above the substrate 1. The TFT layer 2 comprises stacked a light blocking layer 21, a buffer layer 22, an active layer 23, a gate insulating layer 24, a gate layer 25, an inter-layer insulating layer 26, and a source/drain layer 27. The light blocking layer 21 covers at least a part of the active layer 23 in an upward view in order to block light for the active layer 23. The material of the blocking layer 21 could comprise a black metal. The buffer layer 22 could comprise an inorganic material such as silicon nitride or silicon oxide. The active layer 23 could comprise a semiconductor material, such as amorphous, polysilicon, or single crystalline silicon, a semiconductor oxide material, such as IGZO (Indium Gallium Zinc Oxide), or a metal oxide, such as ZnO. The gate insulating layer 24 could comprise an inorganic material, such as silicon nitride or silicon oxide. The gate layer 25 could comprise a gate 250 of the TFT 20. The gate 250 is opposite to the channel region in the active layer 23 to achieve the switch control of the TFT 20. The gate layer 25 could comprise a metal material such as Mo or Ti. The interlayer insulating layer 26 could comprise an inorganic material, such as silicon oxide. The source/drain layer 27 could comprise a source 271 and a drain 272 of the TFT 20. The source 271 and the drain 272 are respectively electrically connected to the source region and the drain region of the active layer 23 through the via of the interlayer insulating layer 26. The drain 272 is electrically connected to the light blocking layer 21 through the via passing though the interlayer insulating layer 26 and the buffer layer 22. The source/drain layer 27 could comprise a metal material, such as Cu.

The auxiliary electrode 3 is positioned above the substrate 1. The auxiliary electrode 3 is electrically connected to the second electrode 62. In this way, the resistance of the second electrode 62 could be reduced and the IR drop is improved.

The protection layer 4 is positioned above the source/drain layer 27 of the TFT layer 2. The protection layer 4 comprises a first opening. The first opening 41 exposes the drain 272 of the TFT 20. The protection layer 4 could comprise a passivation layer, which could comprise silicon nitride.

The connection layer 5 is positioned above the protection layer 4. The connection layer 5 comprises a connection portion 51 and a blocking portion 52. The blocking portion 52 and the protection layer 4 jointly form the via (the second opening) 42. The upper width of the via 42 is greater than the lower width of the via 42. Here, when the cross-section of the via 42 is a round, the width of the via 42 is its diameter. When the cross-section of the via 42 is not a round, the upper width of the via 42 is greater than the lower width of the via 42. That is, in a longitudinal cross-section, the upper width of the via 42 is greater than the lower width of the via 42 such that the light emitting layer 60 is disconnected by the via 42. The connection layer 5 could comprise a metal material, such as Mo or Ti that would not be easily oxidized or vulcanized.

The first electrode 61 is positioned above the connection layer 5. The first electrode 61 is electrically connected to the drain 272 of the TFT 20 through the connection portion at the position of the first opening 41. The first electrode 61 could be an anode, which comprises stacked materials of ITO/Ag/ITO. The first electrode 61 has a transparent rate greater than 90%.

The light emitting layer 60 is positioned above the first electrode 60. Because the upper width of the via 42 is greater than the lower width of the via. When the light emitting material is deposited to form the light emitting layer 60, the light emitting layer could be disconnected at the via 42. The light emitting layer 60 could comprise an organic light emitting material, such as red-light organic light emitting material, green-light light emitting material and blue-light organic light emitting material. The light emitting layer 60 is electrically connected to the first electrode 61 and the second electrode 62 and could form a plurality of sub-pixels generating light of different colors.

The second electrode 62 is positioned above the light emitting layer 60. The light emitting layer 60 is disconnected at the position of the via 42. Therefore, the second electrode 62 could be electrically connected to the auxiliary electrode 3 through the via 42. The second electrode 62 could be a cathode, comprising Mg and Ag. The cathode could be manufactured by deposition or magnetron sputtering.

The display panel 100 comprises a connection layer 5 between the TFT 2 and the first electrode 61. The connection layer could ensure the electrical connection between the TFT layer 2 and the first electrode 61 through the connection portion 51 and could form a stable via 42 through the blocking portion 52 and the protection layer 4. This allows the second electrode 62 to be electrically connected to the auxiliary electrode 3 through the via 42, which could effectively and stably reduces the resistance of the second electrode 62 and improves the luminance unevenness between the edge and the center of the display panel 100.

Please refer to FIG. 2. FIG. 2 is a diagram of a cross section of a display panel according to an embodiment of the present disclosure. The auxiliary electrode 3 and the drain 272 are in the same layer and manufactured by the same material. The auxiliary electrode 3 could comprise Cu, Ti, Al and/or other metal materials. In this way, when the source 271 and the drain 272 are patterned, the auxiliary electrode 3 could be simultaneously formed to reduce a process step.

The source/drain layer 27 comprises a solder pad 273 positioned in the non-display region 102 of the display panel 100. The solder pad 273 is used to receive electric signals from the non-display panel to introduce the signals into the source 271 or the drain 272 of the TFT 20 in the display region 101. The protection layer 4 comprises a fourth opening that exposes the solder pad 273. The connection layer 5 further comprises a protection portion 53 electrically connected to the solder pad through the fourth opening 44. In a top view, the protection portion 53 completely covers the solder pad 273. In this way, the solder pad 273 of the source/drain layer 27 could be protected by the protection portion 53. This could protect the exposed solder pad 273 from erosion.

The light emitting layer 60 comprises a first part 65 inside the via 42. The second electrode 62 comprises second part 66 inside the via 42. The second part 66 is positioned above the first part 65. The second part 66 directly contacts the auxiliary electrode 3 in the via 42 to be electrically connected to the auxiliary electrode 3. In this way, the second electrode 62 could be electrically connected to the auxiliary electrode 3 at the disconnecting position such that the resistance of the second electrode 62 could be reduced.

Figure 3:
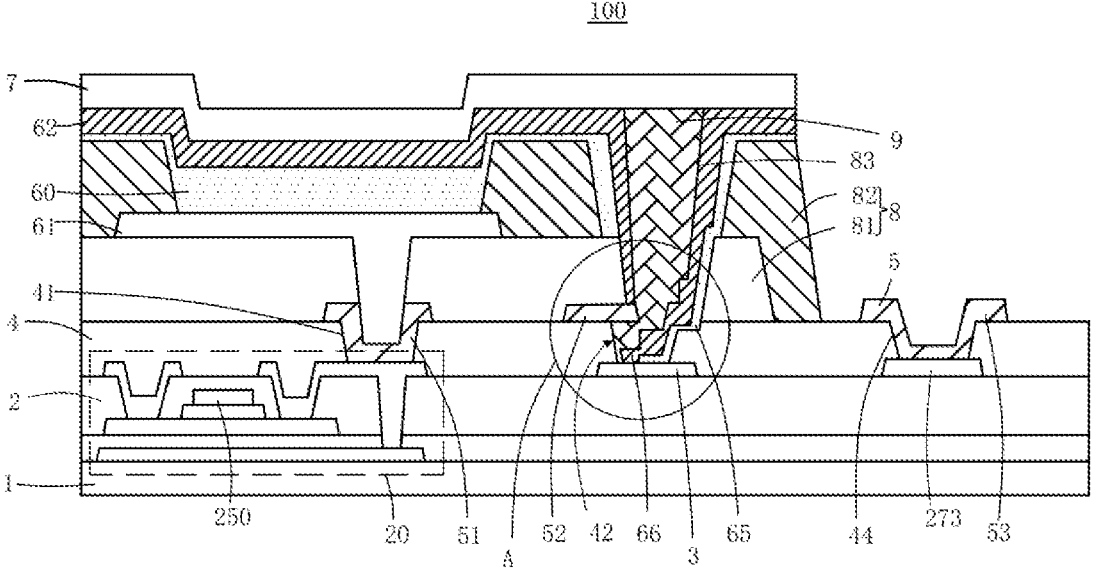
FIG. 3 is a diagram of a cross section of a display panel according to an embodiment of the present disclosure.
Figure 4:
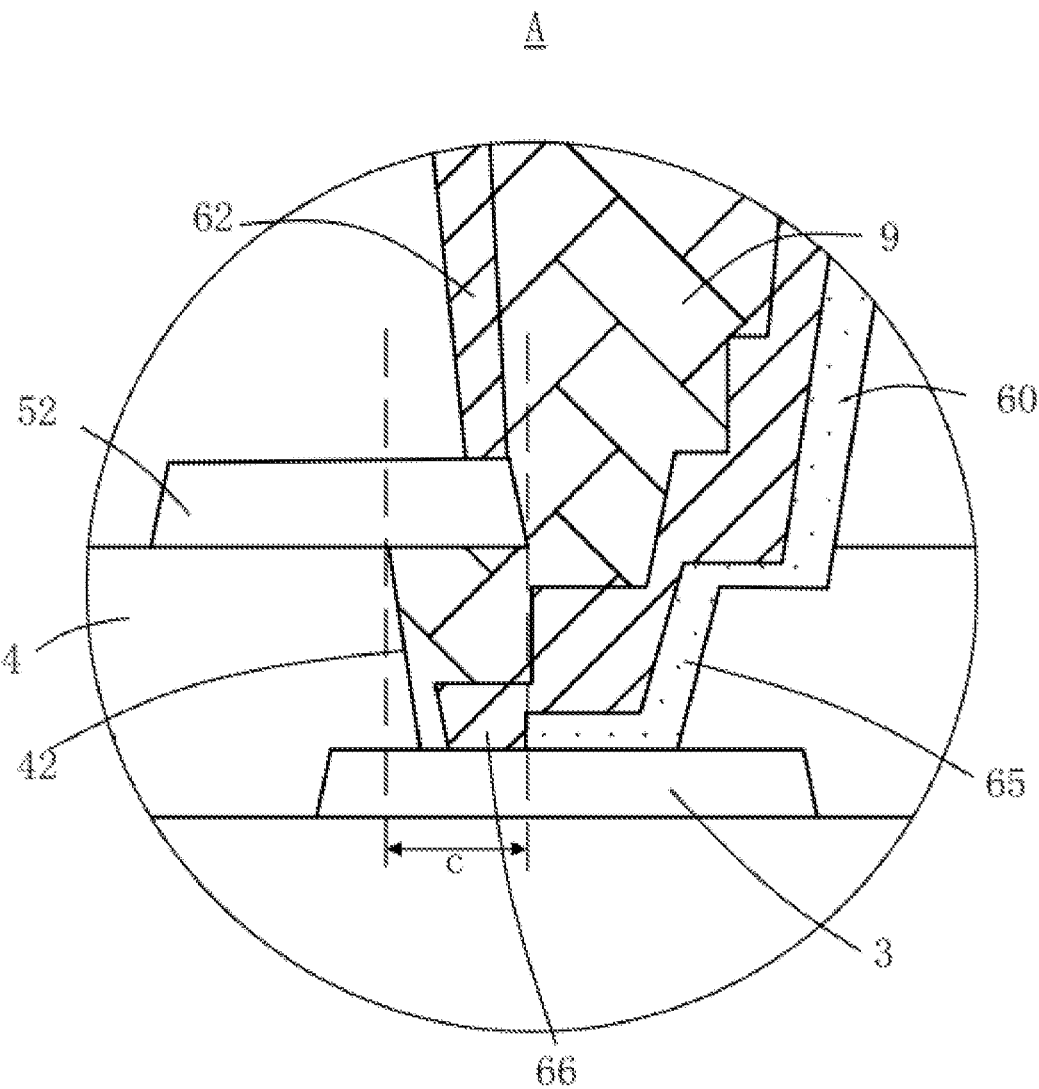
FIG. 4 is a scale-up diagram of a part A shown in FIG. 3.

Please refer to FIG. 3 and FIG. 4. FIG. 3 is a diagram of a cross section of a display panel according to an embodiment of the present disclosure. FIG. 4 is a scale-up diagram of a part A shown in FIG. 3. As shown in FIG. 4, the contact part between the second part 66 and the auxiliary electrode 3 is positioned within the blocking range C of the blocking portion 52. In this way, the undercut structure could ensure the light emitting layer 60 to be disconnected without affecting the direct contact between the second part 66 of the second electrode 62 and the auxiliary electrode 3.

As shown in FIG. 3, the display panel 100 further comprises a packaging layer 7 positioned above the first electrode 61 and the second electrode 62. The display panel 100 further comprises a middle film layer 8 and a filling layer 9 positioned between the packaging layer 7 and the connection layer 5.

The packaging layer 7 is used to protect the light emitting layer 60 to reduce the damages on the light emitting layer 60 introduced by moisture or oxygen. The packaging layer 7 comprises a stacked structure, comprising a first inorganic layer, a first organic layer above the first inorganic layer, and a second inorganic layer above the first organic layer. The packaging layer could further comprise a glass packaging structure.

The middle film layer 8 could comprise a planarization layer 81 and a pixel definition layer 82. The planarization layer 81 is positioned between the connection layer 5 and the first electrode 61. The pixel definition layer 82 is positioned between the first electrode 61 and a light emitting layer 60. The pixel definition layer 82 comprises a plurality of openings for placing a part of the light emitting layer 60 to prevent the ink material from leaking. The second electrode 62, the light emitting layer 60, the pixel definition layer 82 and the planarization layer 81 could jointly have a third opening 42 connected to the via 42. However, the third opening 43 is often deeper. The packaging layer 7 could be formed by CVD (chemical vapor deposition) and may be cracked at the position of the third opening 43.

Therefore, the filling layer 9 is used to fill up the third opening 43 to support the packaging layer 7. The filling layer 9 could comprise a transparent organic resistor material. In this way, the filling layer 9 is filled up in the third opening 43 of the middle film layer 8 and directly contacts the packaging layer 7 through the coating, photography, and etching processes. This could improve the cracking phenomenon of the packaging layer 7 in the third opening 43 to avoid a packaging failure.

According to an embodiment of the present disclosure, a display device is disclosed. The display device comprises the above-mentioned display panel 100. The display device could be a fixed terminal, such as TV, a desktop computer, a mobile terminal, such as a smart phone, a tablet, or a wearable equipment, such as a smart watch, a virtual reality equipment, or a reality enhancement equipment.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising:
a thin film transistor (TFT) layer, comprising a TFT;
an auxiliary electrode;
a protection layer, positioned above the TFT layer and the auxiliary electrode;
a connection layer, positioned above the protection layer, the connection layer comprising a blocking portion, wherein the blocking portion and the protection layer have a via;
a first electrode, positioned above the connection layer and electrically connected to the TFT;
a second electrode, positioned above the connection layer; and
a light emitting layer, positioned above the connection layer and electrically connected to the first electrode and the second electrode;
wherein the light emitting layer is disconnected at a position of the via, and the second electrode is electrically connected to the auxiliary electrode through the via;
the display panel further comprises:
a packaging layer positioned above the first electrode, the second electrode and the light emitting layer;
a middle film layer; and
a filling layer;
wherein the middle film layer and the filling layer are positioned between the packaging layer and the connection layer; the middle film layer comprises a third opening connected to the via; and the filling layer fills up the third opening and supports the packaging layer;
wherein the middle film layer comprises:
a planarization layer, positioned between the connection layer and the first electrode; and a pixel definition layer, positioned between the first electrode and the light emitting layer;

wherein the third opening pass through the second electrode, the light emitting layer, the pixel definition layer and the planarization layer; and the filling layer contacts the packaging layer.

2. The display panel of claim 1, wherein the light emitting layer comprises a first part disconnected at the position of the via, the second electrode comprises a second part disconnected at the position of the via, and the second part is positioned above the first part and electrically connected to the auxiliary electrode through the via.

3. The display panel of claim 2, wherein the second part directly contacts the auxiliary electrode and a contact part of the second part contacting the auxiliary electrode is blocked by the blocking portion.

4. The display panel of claim 1, wherein the TFT layer comprises a source/drain layer, the source/drain layer comprises a drain of the TFT, the protection layer has a first opening, the connection layer comprises a connection part, and the first electrode is electrically connected to the drain of the TFT through the connection part at the first opening.

5. The display panel of claim 4, wherein the auxiliary electrode and the drain are at a same layer and of a same material.

6. The display panel of claim 4, wherein the source/drain layer further comprises a solder pad positioned in a non-display region of the display panel; the protection layer comprises a fourth opening exposing the solder pad; the connection layer comprises a protection portion electrically connected to the solder pad through the fourth opening; and the protection portion fully covers the solder pad in a top view.

7. The display panel of claim 1, wherein a material of the connection layer comprises molybdenum and/or titanium.

8. A display panel comprising:

a thin film transistor (TFT) layer, comprising a TFT;

an auxiliary electrode;

a protection layer, positioned above the TFT layer and the auxiliary electrode, the protection layer comprising a first opening;

a connection layer, positioned above the protection layer, the connection layer comprising a blocking portion, wherein the blocking portion and the protection layer comprise a second opening and a lower width of the second opening is greater than an upper width of the second opening;

a first electrode, positioned above the connection layer;

a second electrode, positioned above the first electrode; and a light emitting layer, positioned between the first electrode and the second electrode;

wherein a material of the connection layer comprises molybdenum and/or titanium, the first electrode is electrically connected to the TFT through the connection portion at a position of the first opening; the light emitting layer is disconnected at a position of the second opening; and the second electrode is electrically connected to the auxiliary electrode through the second opening;

the display panel further comprises:

a packaging layer positioned above the first electrode, the second electrode and the light emitting layer;

a middle film layer; and a filling layer;

wherein the middle film layer and the filling layer are positioned between the packaging layer and the connection layer; the middle film layer comprises a third opening connected to the via; and the filling layer fills up the third opening and supports the packaging layer;

wherein the middle film layer comprises:

a planarization layer, positioned between the connection layer and the first electrode; and a pixel definition layer, positioned between the first electrode and the light emitting layer;

wherein the third opening pass through the second electrode, the light emitting layer, the pixel definition layer and the planarization layer; and the filling layer contacts the packaging layer.

9. The display panel of claim 8, wherein the light emitting layer comprises a first part disconnected at the position of the second opening; the second electrode comprises a second part disconnected at the position of the second opening, and the second part is positioned above the first part and electrically connected to the auxiliary electrode through the second opening.

10. The display panel of claim 9, wherein the second part directly contacts the auxiliary electrode through the second opening and a contact part of the second part contacting the auxiliary electrode is blocked by the blocking portion.

11. The display panel of claim 8, wherein the TFT layer comprises a source/drain layer that comprises a drain of the TFT, and the first electrode is electrically connected to the drain of the TFT through the connection part at the first opening.

12. The display panel of claim 11, wherein the auxiliary electrode and the drain are at a same layer and of a same material.

13. The display panel of claim 11, wherein the source/drain layer further comprises a solder pad positioned in a non-display region of the display panel;

the protection layer comprises a fourth opening exposing the solder pad; the connection layer comprises a protection portion electrically connected to the solder pad through the fourth opening; and the protection portion fully covers the solder pad in a top view.

14. A display device, comprising a display panel, the display panel comprising:

a thin film transistor (TFT) layer, comprising a TFT;

an auxiliary electrode;

a protection layer, positioned above the TFT layer and the auxiliary electrode;

a connection layer, positioned above the protection layer, the connection layer comprising a blocking portion, wherein the blocking portion and the protection layer have a via;

a first electrode, positioned above the connection layer and electrically connected to the TFT;

a second electrode, positioned above the connection layer; and a light emitting layer, positioned above the connection layer and electrically connected to the first electrode and the second electrode;

wherein the light emitting layer is disconnected at a position of the via, and the second electrode is electrically connected to the auxiliary electrode through the via;

the display panel further comprises:

a packaging layer positioned above the first electrode, the second electrode and the light emitting layer;

a middle film layer; and a filling layer;

wherein the middle film layer and the filling layer are positioned between the packaging layer and the connection layer; the middle film layer comprises a third opening connected to the via; and the filling layer fills up the third opening and supports the packaging layer; wherein the middle film layer comprises:

a planarization layer, positioned between the connection layer and the first electrode; and a pixel definition layer, positioned between the first electrode and the light emitting layer;

wherein the third opening pass through the second electrode, the light emitting layer, the pixel definition layer and the planarization layer; and the filling layer contacts the packaging layer.

15. The display device of claim 14, wherein the light emitting layer comprises a first part disconnected at the position of the via, the second electrode comprises a second part disconnected at the position of the via, and the second part is positioned above the first part and electrically connected to the auxiliary electrode through the via.

16. The display device of claim 15, wherein the second part directly contacts the auxiliary electrode and a contact part of the second part contacting the auxiliary electrode is blocked by the blocking portion.

17. The display device of claim 14, wherein the TFT layer comprises a source/drain layer, the source/drain layer comprises a drain of the TFT, the protection layer has a first opening, the connection layer comprises a connection part, and the first electrode is electrically connected to the drain of the TFT through the connection part at the first opening.

18. The display device of claim 17, wherein the auxiliary electrode and the drain are at a same layer and of a same material.

19. The display device of claim 17, wherein the source/drain layer further comprises a solder pad positioned in a non-display region of the display panel; the protection layer comprises a fourth opening exposing the solder pad; the connection layer comprises a protection portion electrically connected to the solder pad through the fourth opening; and the protection portion fully covers the solder pad in a top view.

20. The display device of claim 14, wherein a material of the connection layer comprises molybdenum and/or titanium.

* * * * *